United States Patent
Fan et al.

(10) Patent No.: US 12,412,747 B2
(45) Date of Patent: Sep. 9, 2025

(54) POST-PROCESSING OF INDIUM-CONTAINING COMPOUND SEMICONDUCTORS

(71) Applicant: SPTS Technologies Limited, Newport (GB)

(72) Inventors: Weikang Fan, Newport (GB); Adam S. Beachey, Newport (GB)

(73) Assignee: SPTS Technologies Limited, Newport (GB)

( * ) Notice: Subject to any disclaimer, the term of this patent is extended or adjusted under 35 U.S.C. 154(b) by 322 days.

(21) Appl. No.: 18/123,954

(22) Filed: Mar. 20, 2023

(65) Prior Publication Data
US 2024/0006159 A1  Jan. 4, 2024

(30) Foreign Application Priority Data

Jun. 30, 2022  (GB) ..................... 2209654

(51) Int. Cl.
*H01L 21/306* (2006.01)
*H01L 21/3065* (2006.01)
*G02B 6/12* (2006.01)
*G02B 6/136* (2006.01)
*H01J 37/32* (2006.01)

(52) U.S. Cl.
CPC .... *H01L 21/30621* (2013.01); *H01L 21/3065* (2013.01); *G02B 2006/12078* (2013.01); *G02B 6/136* (2013.01); *H01J 37/32082* (2013.01); *H01J 37/3244* (2013.01); *H01J 2237/334* (2013.01)

(58) Field of Classification Search
CPC .......... H01L 21/30621; H01L 21/3065; G02B 6/136; G02B 2006/12078; H01J 37/32082; H01J 37/3244
See application file for complete search history.

(56) References Cited

U.S. PATENT DOCUMENTS

| | | | | |
|---|---|---|---|---|
| 4,285,763 A * | 8/1981 | Coldren | ............ | H01L 21/30621 438/712 |
| 5,275,692 A * | 1/1994 | Barkanic | ........... | H01L 21/32137 438/719 |
| 6,579,802 B1 * | 6/2003 | Pierson | ............. | H01L 21/30621 438/711 |

(Continued)

FOREIGN PATENT DOCUMENTS

| | | | | |
|---|---|---|---|---|
| DE | 102013100035 A1 * | 12/2013 | ....... | H01L 21/30621 |
| EP | 3836195 A1 * | 6/2021 | ........ | H01J 37/32082 |

(Continued)

OTHER PUBLICATIONS

WO-2013174912-A1 English language description (Year: 2013).*

(Continued)

*Primary Examiner* — Anita K Alanko
(74) *Attorney, Agent, or Firm* — Hodgson Russ LLP (57) ABSTRACT

A method of plasma etching an indium-containing compound semiconductor substrate and plasma etch apparatus for plasma etching an indium-containing semiconductor substrate can use a primary plasma etching process and a secondary plasma etching process. The primary plasma etching process uses a halogen-containing component and a nitrogen-containing component. The secondary plasma etching process uses an oxygen-containing component.

15 Claims, 5 Drawing Sheets

(a)

(b)

(56) References Cited

U.S. PATENT DOCUMENTS

| | | | | |
|---|---|---|---|---|
| 2001/0025826 A1* | 10/2001 | Pierson | ............ | H01L 21/30621 |
| | | | | 216/75 |
| 2005/0181616 A1* | 8/2005 | Wang | ................ | H01L 21/30621 |
| | | | | 257/E21.222 |
| 2020/0135901 A1* | 4/2020 | Chang | ................ | H01L 21/31116 |
| 2020/0273711 A1* | 8/2020 | Yoshida | ............ | H01L 21/31111 |
| 2021/0175082 A1* | 6/2021 | Ashraf | ................ | H01L 21/3065 |

FOREIGN PATENT DOCUMENTS

| | | | | |
|---|---|---|---|---|
| GB | 2369927 A * | 6/2002 | ......... | H01L 21/3065 |
| WO | WO-0124243 A1 * | 4/2001 | ....... | H01L 21/30621 |
| WO | WO-2013174912 A1 * | 11/2013 | ....... | H01L 21/30621 |

OTHER PUBLICATIONS

IPO, Search Report for GB Application No. 2209654.9, Dec. 13, 2022.

Ishutkin et al., "The Method of Low-Temperature ICP Etching of InP/InGaAsP Heterostructures in $Cl_2$-Based Plasma for Integrated Optics Applications," Micromachines, vol. 12, No. 1535, 2021.

* cited by examiner

POST-PROCESSING OF INDIUM-CONTAINING COMPOUND SEMICONDUCTORS

CROSS-REFERENCE TO RELATED APPLICATIONS

This application claims priority to UK Patent Application No. 2209654.9 filed Jun. 30, 2022, the disclosure of which is hereby incorporated by reference.

FIELD OF THE DISCLOSURE

This invention relates to a method of plasma etching an indium-containing compound semiconductor substrate. This invention also relates to a plasma etching apparatus.

BACKGROUND

Indium-containing compound semiconductors, including InP and related alloys such as InGaAsP, are widely used in electro-optical and optical devices. Devices based on these materials are critical in optical communications applications. Common structures produced when plasma etching Indium-containing compound semiconductor structures include trench or waveguide features several microns deep. These trench or waveguide features require smooth bases and sidewalls, and the sidewalls require an angle of inclination approaching 90°. Furthermore, when etching heterostructures, it is important to avoid notching at the interface between layers. Mesa type structures may have similar requirements. To achieve the necessary anisotropy, passivation during the etching process is typically required. Ion bombardment at the bottom of the feature removes the passivation at the base of the feature while the passivation on the sidewall inhibits lateral etching. The etchant gas mixtures used in these processes are typically based on $Cl_2$ and/or HBr. For example, $CH_4/H_2/Cl_2$, $CH_4/Ar/Cl_2$, $CH_4/H_2$, $Cl_2/N_2$, $Cl_2/H_2$, $Cl_2/N_2/Ar$, HBr, HBr/Ar & $HBr/N_2$ are all known etchant gas mixtures.

Etchant gas mixtures using chlorine provide relatively high etch rates of greater than 1 μm/min and, with the use of a passivation gas such as $CH_4$, $O_2$ or $N_2$, can provide anisotropic etching of Indium-containing compound semiconductor materials. However, passivation control can be a challenge, with residual passivation on the base of the feature or on the sidewalls resulting in an unacceptable degree of surface roughness and local thickness variability. Roughness and an uneven base are undesirable as they both result in degradation of final device performance. For example, in an optical waveguide, there is a requirement for very smooth uniform side and base surfaces to minimize the loss of light in the waveguide. Excessive amount of passivation also causes difficulties in the subsequent fabrication process and can result in additional costs to remove the unwanted material.

A solution has been proposed in "The Method of Low-Temperature ICP Etching of InP/InGaAsP Heterostructures in Cl2-Based Plasma for Integrated Optics Applications", Sergey Ishutkin et al., Micromachines 2021, 12, 1535 for removing the passivation material and smoothing the base and sidewalls of features formed in Indium-containing compound semiconductors. This solution involves performing a cyclic etching process to limit the development of surface roughness. However, this processing method requires precise process tuning and configuration, which increases the complexity of the process.

Therefore, there is a need in the art to provide an improved method of etching Indium-containing compound semiconductors that removes passivation, reduces surface roughness and provides a flat base in a simplified and flexible process.

STATEMENT OF INVENTION

The present invention, in at least some of its embodiments, seeks to address the above described problems, desires and needs.

According to a first embodiment of the present invention there is provided a method of plasma etching an indium-containing compound semiconductor substrate, the method comprising the steps of:

providing a substrate on a substrate support within a chamber, wherein the substrate comprises an indium-containing compound semiconductor material;

performing a primary plasma etching process by generating a plasma from a first etchant gas mixture within the chamber to plasma etch the indium-containing compound semiconductor material to form an etched substrate, wherein the etchant gas mixture comprises a halogen-containing component and a nitrogen-containing component; and performing a secondary plasma etching process by generating a plasma from a second etchant gas or gas mixture comprising an oxygen-containing component, wherein an RF bias power is applied to the etched substrate during the secondary etching process and the RF bias power is between about 10 W and about 50 W.

Without wishing to be bound by any theory or conjecture, it is believed that passivation material is formed from $InN_x$ compounds formed by reaction between the Indium-containing substrate and the Nitrogen-containing component in the primary plasma etching process. Surprisingly, the oxygen-containing plasma of the secondary plasma etching process not only reacts with and removes the passivation material on the sidewalls and base of the etched feature, but also reacts with the Indium-containing surface material resulting in material removal and producing $InO_x$. It is believed that this reaction is heavily dependent on the surface structure, hence areas with increased surface roughness or protrusions are preferentially etched over smoother areas. The secondary plasma etching process removes both passivation material and excess indium-containing surface material contributing to surface roughness without requiring complex configuration of the etching conditions or a separate polishing process. Furthermore, the secondary plasma etching process can be performed equally well in the same chamber with a maintained vacuum from the primary plasma etching process (in situ) or with a change in vacuum conditions and/or location (ex situ). This means that the method of the present invention may be performed with a greater degree of flexibility than other known methods.

The indium-containing compound semiconductor material can be selected from the group consisting of InP, InGaAs, InGaAsN, InAlGaN and InGaAsP. The indium-containing compound semiconductor material may be InP. The substrate can be an indium-containing compound semiconductor wafer. The substrate can be a 75 mm indium-containing compound semiconductor wafer. The substrate may comprise at least one epitaxial layer of the indium-containing compound semiconductor material. The substrate may further comprise a carrier wafer.

The RF bias power applied to the substrate during the secondary etching process may be between about 15 W and about 40 W. The RF bias power applied to the substrate during the secondary etching process may be between about 20 W and about 30 W.

The second etchant gas or gas mixture may consist of or consist essentially of an oxygen-containing component. The oxygen-containing component may comprise $O_2$, $H_2O$, $N_2O$ and/or $O_3$. The oxygen-containing component may be $O_2$. The flow rate of the oxygen-containing component may be between about 25 sccm and about 75 sccm. The flow rate of the oxygen-containing component may be about 50 sccm.

The primary etching process may be performed at a temperature of at least 150° C. The primary etching process may be performed at a temperature of between about 150° C. and about 250° C. The primary etching process may be performed at a temperature of about 175° C. Using a temperature of at least 150° C., preferably of about 175° C., for the primary etching process prevents redeposition of $InCl_x$ onto the substrate surface, which can result in "micromasking" and the formation of protrusions on the etch front which are undesirable for device operation. The secondary etching process may be performed at a temperature of at least 150° C., optionally between about 150° C. and about 250° C., further optionally about 175° C. The halogen-containing component may be a chlorine-containing component. The chlorine-containing component may be selected from the group consisting of $Cl_2$, $SiCl_4$ and $BCl_3$. Optionally, the chlorine-containing component is $Cl_2$. Alternatively, the halogen-containing component may be HBr.

The nitrogen-containing component may be $N_2$.

The substrate may comprise a mask formed on a surface which, during the etching process, is opposite a surface in contact with the substrate support. The mask can be a hard mask, such as an inorganic dielectric mask. The mask may comprise a Silicon-containing component, such as $SiO_2$, SiN or SiC. The mask may comprise $SiO_2$.

The plasma generated in the primary and/or the secondary plasma etching process may be an inductively coupled plasma.

An electrical bias power applied to the substrate during the primary plasma etch step can be between about 10 W and about 100 W. An electrical bias power applied to the substrate during the primary plasma etch step can be between about W and about 60 W. The electrical bias power can be an RF bias power. A plasma source power applied to the chamber during the primary plasma etch step and/or the secondary plasma etch step can be between about 100 W and 1000 W. A plasma source power applied to the chamber during the primary plasma etch step and/or the secondary plasma etch step can be between about 500 W and 700 W. A plasma source power applied to the chamber during the primary plasma etch step can be about 600 W. The primary plasma etch step and/or the secondary plasma etch step can be carried out at a pressure of between about 2 mTorr (0.267 Pa) and about 15 mTorr (2.00 Pa). The secondary plasma etch step can be carried out at a pressure of about 5 mTorr (0.667 Pa).

The first etchant gas mixture used for the primary plasma etch step can consist of or consist essentially of at least one chlorine-containing component (e.g. $Cl_2$ and/or $SiCl_4$), a nitrogen-containing component (e.g. $N_2$) and Hz. The flow rate of the at least one chlorine-containing component can be between 5 sccm and 50 sccm. The flow rate of the at least one chlorine-containing component can be between 10 and 20 sccm. The flow rate of the nitrogen-containing component can be between 5 sccm and 30 sccm. The flow rate of the nitrogen-containing component can be between 10 sccm and 20 sccm. The flow rate of $H_2$ can be between 1 sccm and 10 sccm. The flow rate of $H_2$ can be about 5 sccm.

The primary plasma etch step and the secondary plasma etch step can be performed using an inductively coupled plasma (ICP) etch apparatus.

The secondary plasma etch step may be performed for a duration of at least 3 minutes. The secondary plasma etch step may be performed for a duration of at least 5 minutes. The secondary plasma etch step may be performed for a duration of at least 120 minutes.

According to a second embodiment of the present invention there is provided a plasma etch apparatus for plasma etching an Indium-containing compound semiconductor substrate using the method according to the first embodiment of the present invention, the apparatus comprising:
  a chamber;
  a substrate support disposed within the chamber for supporting a substrate thereon;
  at least one gas inlet for introducing a gas or gas mixture into the chamber at a flow rate;
  a plasma generating means for sustaining a plasma in the chamber;
  a power supply for supplying an RF bias power to the substrate support of at least 10 W and up to 50 W, and
  a controller configured to switch between a first set of processing conditions and a second set of processing conditions,
  wherein the first set of processing conditions are configured to perform a primary plasma etching process by generating a plasma from a first etchant gas mixture within the chamber to plasma etch the substrate to form an etched substrate, wherein the first etchant gas mixture comprises a halogen-containing component and a nitrogen-containing component, and the second set of processing conditions are configured to perform a secondary plasma etching process by generating a plasma from a second etchant gas or gas mixture comprising an oxygen-containing component.

For the avoidance of doubt, whenever reference is made herein to 'comprising' or 'including' and like terms, the invention is also understood to include more limiting terms such as 'consisting' and 'consisting essentially'.

Whilst the invention has been described above, it extends to any inventive combination of the features set out above, or in the following description, drawings or claims. For example, any features disclosed in relation to the first embodiment of the invention may be combined with any features of the second embodiment of the invention and vice versa.

DESCRIPTION OF FIGURES

Aspects of methods and apparatuses in accordance with the invention will now be described with reference to the accompanying drawings, in which.

DETAILED DESCRIPTION

Figure 1:
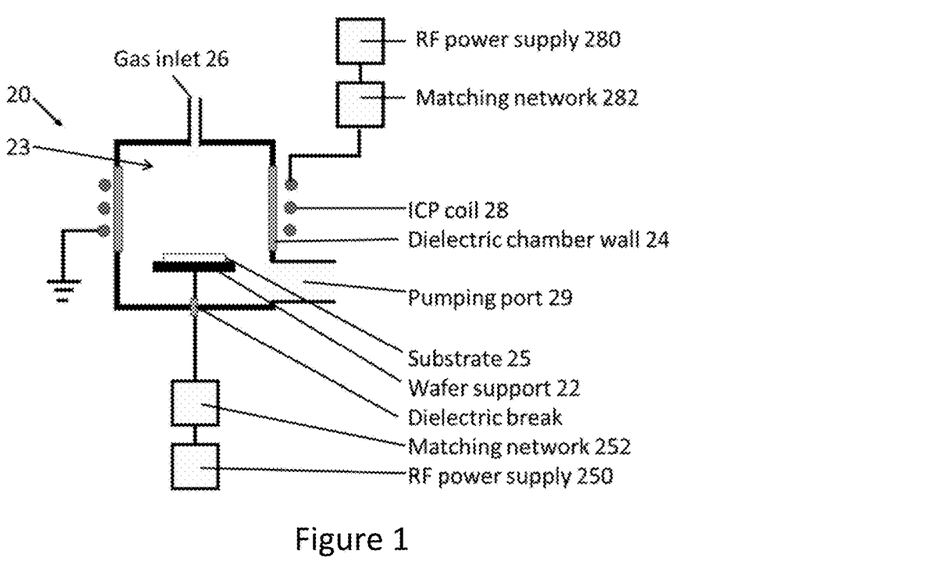
FIG. 1 is a plasma etch apparatus in accordance with a second embodiment of the present invention suitable for performing a method according to a first embodiment of the invention.

FIG. 1 shows a schematic representation of a plasma etch apparatus 20 in accordance with the second embodiment of the invention suitable for performing methods according to the first embodiment of the present invention. Plasma etching of a substrate is performed using a suitable plasma etch apparatus. The plasma etch apparatus can be an inductively coupled plasma (ICP) apparatus. However, etching can also be performed using other plasma etch systems, such as TCP, RIE, ECR or microwave type apparatus. The operation of generating a plasma within such plasma etch apparatus is well-known in the art and will not be described here other than where necessary for an understanding of the present invention.

A plasma etching tool suitable for performing the method of the present invention is an Omega™ ICP etch system configured for 3" (75 mm) wafers available from SPTS Technologies Limited of Newport, UK. A plasma etch apparatus 20 typically comprises a substrate support (or platen) 22, also known as a wafer support, disposed within a chamber 23 for supporting a substrate 25. A bias power can be supplied to the substrate by a RF power supply 250 via an impedance matching network 252. Typical RF frequencies for operation of the RF power supply may be between about 380 kHz and 13.56 MHz. The chamber can comprise a chamber wall having a dielectric part 24. Process gases can be introduced into the chamber via one or more gas inlets 26. A plasma generating means 28, such as an inductive coil, can be used to generate and sustain a plasma within the chamber 23 as is known in the art (e.g. using a RF power supply 280 and impedance matching network 282). The gases can be removed from the chamber 23 via a pumping port 29. Also provided is a controller (not shown) which is configured to control the apparatus to perform the process sequence described herein.

Figure 2:
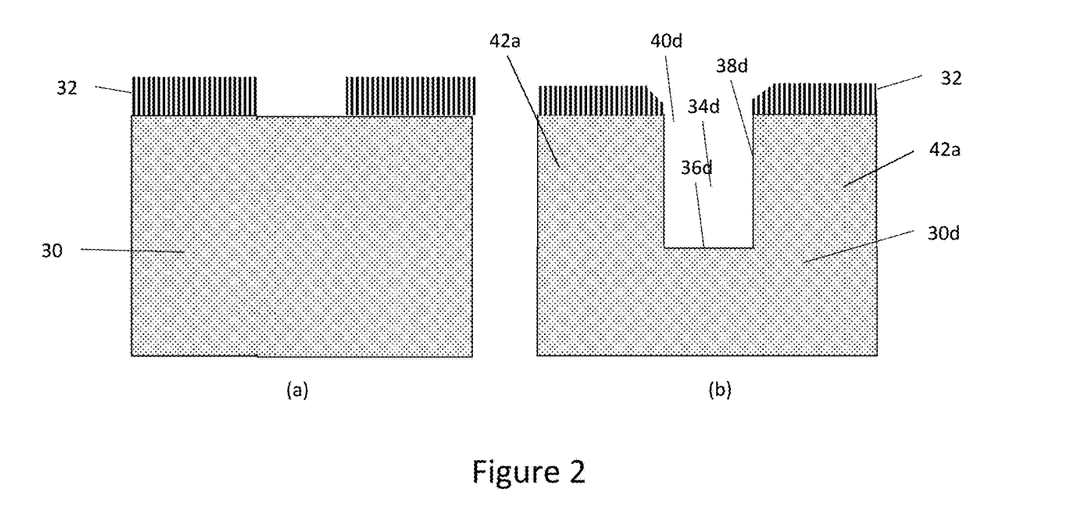
FIG. 2 is a cross-sectional schematic view of a trench a) as patterned and b) post plasma etch.
Figure 4:
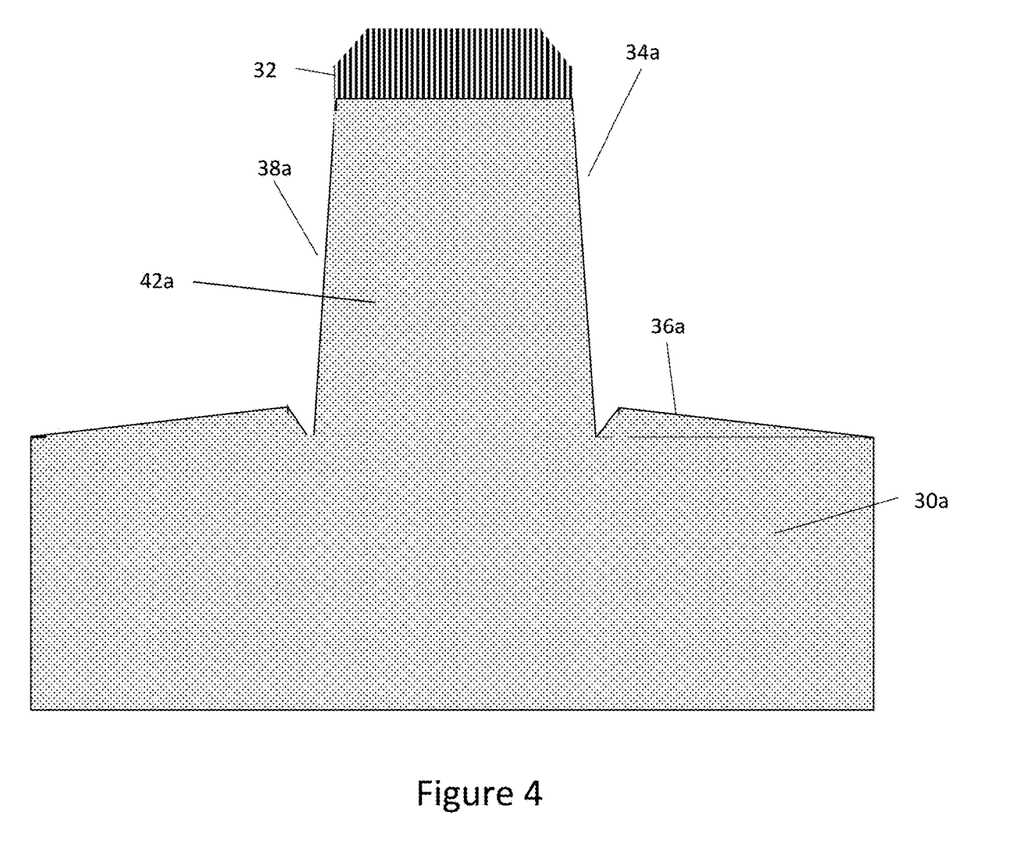
FIG. 4 is a cross-sectional schematic view of a waveguide structure after a primary plasma etching process using a plasma generated from a gas mixture of $Cl_2$, $N_2$ and $H_2$.
Figure 6:
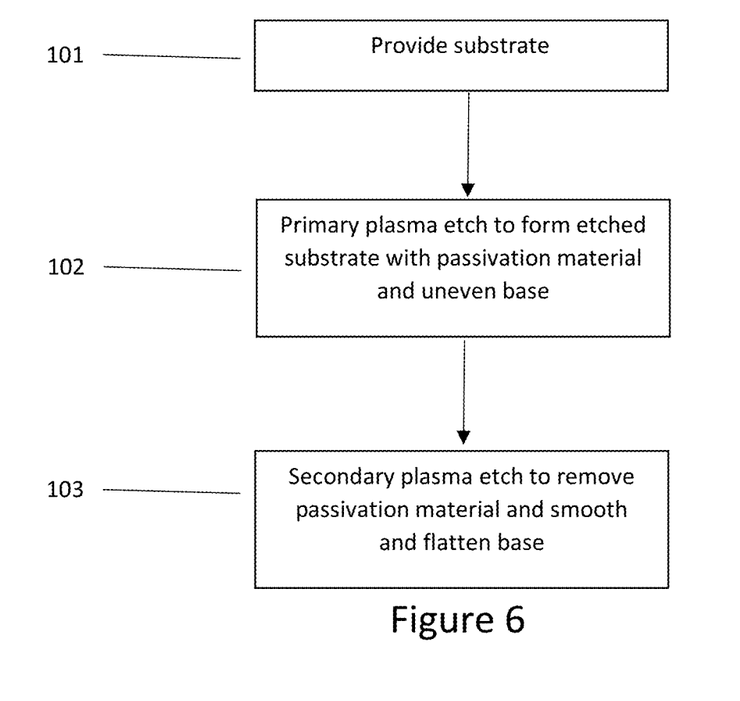
FIG. 6 shows a flow chart of a plasma etching process in accordance with the first embodiment of the invention.

An exemplary method as illustrated in FIG. 6 according to a first embodiment of the present invention will be described. In the exemplary method, an Indium-containing compound semiconductor substrate 30 is etched to form a feature, as shown in FIG. 2. In the exemplary method, the feature is a waveguide structure in the form of a ridge 42a as shown in FIG. 4, where the sides of the ridge 42a are formed by etching trenches 34a in the substrate 30, and the substrate 30 is a 75 mm indium phosphide (InP) wafer. However, other features may be formed and other indium-containing compound semiconductor substrates can alternatively be used in the method of the first embodiment of the present invention. Other wafer sizes may also be used in the method of the first embodiment of the present invention. Although the parameters stated below are those used for the etching of a mm InP wafer, they may be varied with the size of the wafer in a manner known in the art. The substrate 30 includes a patterned mask layer 32, such as a silicon dioxide (SiO$_2$) layer or other suitable mask layer. The mask layer 32 is typically more resistant to the plasma etch conditions that the bulk substrate material.

In a first step 101, the substrate 30 to be etched is positioned on the substrate support 22 in a plasma etch apparatus 20 with the face to be etched facing upwards. A pre-etch may optionally be performed to prepare the substrate 30 prior to the primary plasma etch, for example to remove unwanted material from the open areas of the mask layer 32.

Figure 3:
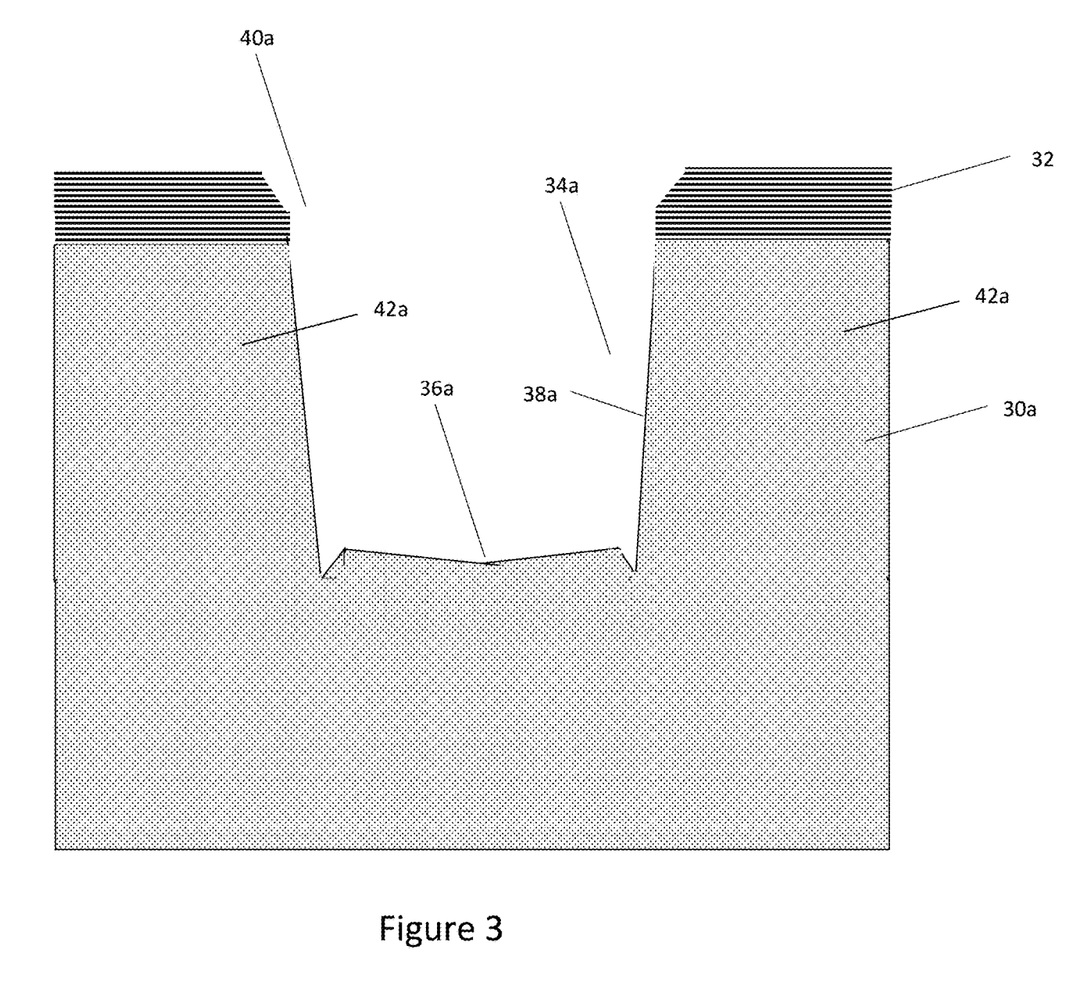
FIG. 3 is a cross-sectional schematic view of a trench after a primary plasma etching process using a plasma generated from a gas mixture of $Cl_2$, $N_2$ and Hz.

In a second step 102, a primary plasma etch step is performed to selectively etch the InP substrate 30a so that a majority of the waveguide structure is formed. Numeral 42a represents the partially-formed waveguide as illustrated in FIG. 3 and numeral 34a represents the trench formed to define the sides of the waveguide 42a. The primary plasma etch step anisotropically etches the substrate 30a in the areas of the substrate 30a that are not covered by the mask layer 32. An RF bias power is applied to the platen 22 during the primary plasma etch step. For example, the RF bias power applied to the platen can be in the range of about 10 W to about 100 W, optionally in the range of about 30 W to about 60 W. This helps to impart a directionality to the species (e.g. ions) in the plasma so that the base 36a of the partially-formed trench 34a is preferentially etched (rather than the sidewalls 38a of the waveguide).

During the primary plasma etch step, the chamber pressure can be in the range of about 2 mTorr (0.267 Pa) to about 15 mTorr (2.00 Pa). During the primary plasma etch step, the plasma source power can be in the range of about 100 W to about 1000 W, optionally about 500 W to about 700 W. RF frequencies for the RF bias power and the RF source power can be between about 2 MHz and about 13.56 MHz. Typically, the platen 22 temperature setpoint is at least 150° C., preferably about 175° C. Using a temperature of at least 150° C., preferably of about 175° C., for the primary etching process prevents redeposition of InCl$_x$ onto the substrate surface, which can result in "micromasking" and the formation of protrusions on the etch front (sometimes known as "grassing" due to the formation of multiple high-aspect ratio protrusions on the etched surface), which are undesirable for device operation. By way of example only, the process gases used in the primary plasma etch step comprises at least one of Cl$_2$ and SiCl$_4$, N$_2$ and can comprise one or both of Ar and H$_2$ gas.

The duration of exposure to the plasma generated during the primary plasma etch step would be expected to vary depending on parameters such as the substrate material and dimensions of the features in a manner known in the art. As an example, the formation of 2.5 μm by 1 μm waveguides in InP substrates would be expected to take approximately 3 minutes.

The primary plasma etch step results in the formation of a partially-formed trench 34a. The partially-formed trench 34a comprises a base 36a that is approximately perpendicular to the sidewalls 38a of the trench 34a and an opening adjacent to the surface of the substrate 30a on which the mask 32 is formed. In the waveguide structure shown in FIG. 4, the waveguide 42a is formed as a ridge with trenches 34a either side of the ridge, with sidewalls 38a and a base 36a either side of the ridge.

Figure 5:
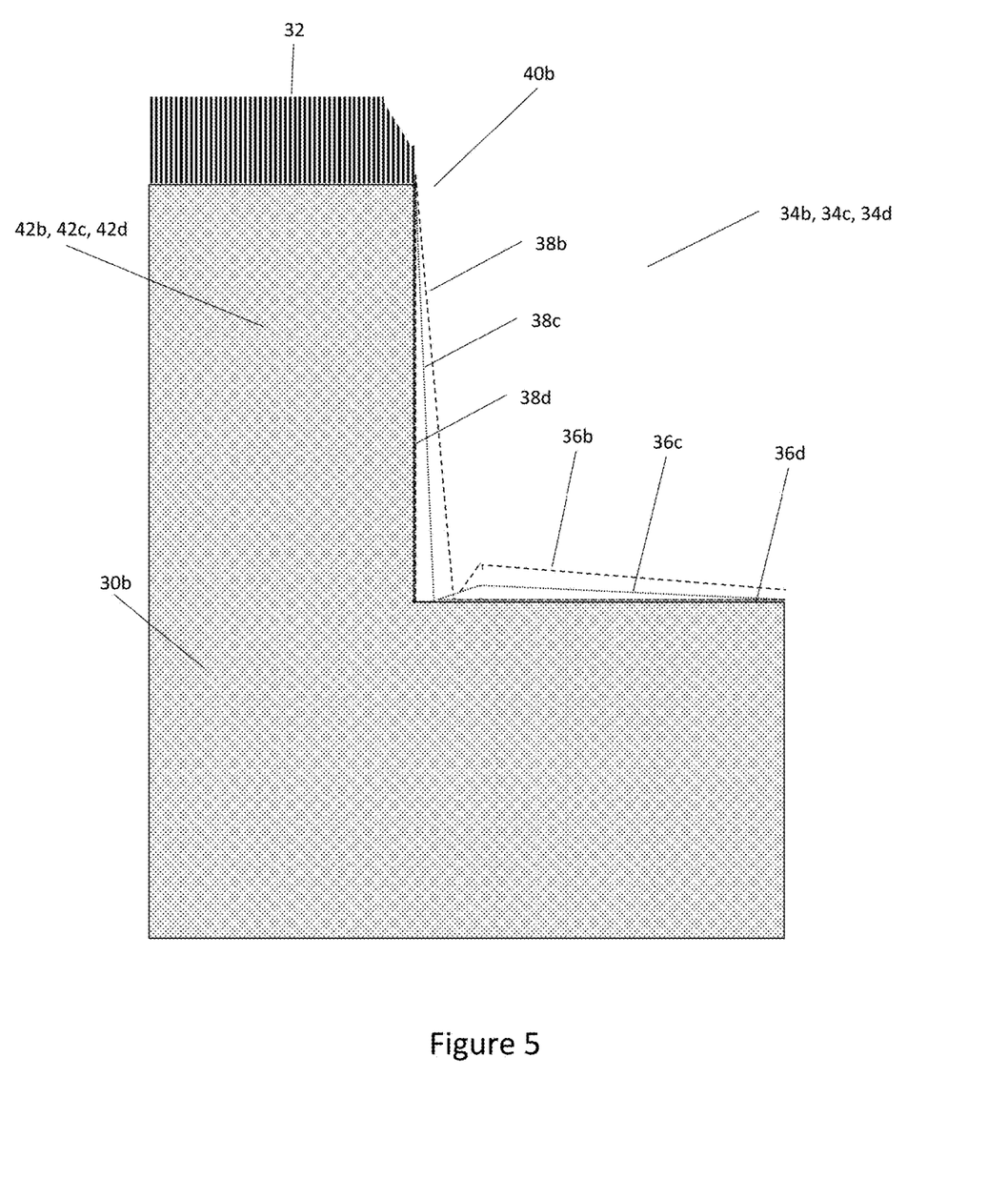
FIG. 5 is a cross-sectional schematic view of a waveguide structure at various stages of processing in accordance with the first embodiment of the invention.

In a third step 103, the substrate 30b is then subjected to a secondary plasma etch step. The plasma processing parameters used during the secondary plasma etch step are different to those used during the primary plasma etch step. The secondary plasma etch step etches the substrate 30b through the opening 40b of the trench 34b to remove the build-up of passivation material on the sidewalls 38b and base 36b of the trench 34b and also further etch the base 36b of the trench 34b, as shown in FIG. 5. This secondary plasma etch step removes both passivation material and excess indium-containing surface material contributing to surface roughness, resulting in a well-defined waveguide structure 42d with substantially flat surfaces and a minimal degree of surface roughness.

A RF bias power of between about 10 W and about 50 W is applied to the platen 22 during the secondary plasma etch step. For example, the RF bias power applied to the platen can be in the range of about 15 W to about 40 W, preferably about 30 W. This helps to impart a directionality to the species (e.g. ions) in the plasma so that the base 36b of the partially-formed trench 34b is preferentially etched (rather than the substrate material in the sidewalls 38b of the trench 34b).

During the secondary plasma etch step, the chamber pressure can be in the range of about 2 mTorr (0.267 Pa) to about 15 mTorr (2.00 Pa). During the secondary plasma etch step, the plasma source power can be in the range of about 100 W to about 1000 W, optionally about 500 W to about 700 W. RF frequencies for the RF bias power can be between about 2 MHz and about 13.56 MHz. Typically, the platen 22 temperature setpoint is at least 150° C., preferably about 175° C. The secondary plasma etch step comprises generating a plasma from a second etchant gas or gas mixture comprising an oxygen-containing component. The oxygen-containing component may comprise $O_2$, $H_2O$, $N_2O$ and/or $O_3$, but is preferably $O_2$. The present inventors have found that the "grassing" effect caused by insufficient temperatures in the primary plasma etch step is also present when the secondary plasma etching process is carried out using argon as the etchant gas. Without wishing to be bound by any theory or conjecture, it is believed that the re-sputtering of Indium-containing substrate material removed by the argon plasma onto the base of the waveguide causes micro-masking, and the formation of the unwanted protrusions. However, by using the etchant gas or gas mixture comprising an oxygen-containing component, the present inventors have found that the resultant trenches 34d and waveguides 42d can be formed to have uniform and smooth base 36d and sidewalls 38d, which are ideal for waveguide functionality.

The duration of the secondary plasma etch step depends on the thickness of the passivation and the level of surface roughness that may be tolerated in the final feature 34d, 42d as illustrated in FIG. 5. The initial profile of an exemplary feature prior to the performance of the secondary plasma etch step is denoted by the reference numerals 34b, 36b, 38b and 42b. In an exemplary embodiment, passivation material having a thickness of approximately 60 nm formed on the sidewalls 38b and base 36b of an exemplary feature 34b, 42b was removed in about 3 minutes of exposure to an $O_2$ plasma generated with a 30 W RF bias in a secondary plasma etch step. A further exposure of between 1 and 2 minutes was required to smooth approximately 50 nm tall base roughness. The profile of an exemplary feature after this initial period of exposure is illustrated by reference numerals 34c, 36c, 38c and 42c.

In order to produce a base with minimal surface roughness, a further exposure to the plasma generated in the secondary plasma etch step may be required. In an exemplary embodiment, a waveguide structure was exposed for an additional period of 120 minutes to an $O_2$ plasma at a 20 W RF bias. The profile of an exemplary feature after this further period of exposure is illustrated by reference numerals 34d, 36d, 38d and 42d. As can be seen in FIG. 5, the resultant profile of the feature 34d, 42d after this treatment is smooth and uniform with minimal residual passivation material and surface roughness. The duration of exposure of the substrate to the plasma generated during the secondary plasma etch step will therefore vary with the acceptable degree of surface roughness and other parameters such as the amount of passivation material present in a manner known in the art. The secondary plasma etch step may be carried out ex-situ in a separate process chamber to allow for processing of a number of wafers in parallel.

The resultant substrate 30d comprises a fully formed feature 34d, 42d which comprises at least one trench 34d having an opening 40d and a substantially flat base 36d as shown in FIG. 2b. The sidewalls 38d may be formed with minimal residual passivation and having an angle of less than 3 degrees from the vertical.

Example 1

Three exemplary sets of process parameters for the primary plasma etch steps of the method of the first embodiment are shown in Table 1. The exemplary process was performed in the Omega™ etch apparatus at a temperature of 175° C. with source and bias RF power supplies, when used, operating at 13.56 MHz on a 75 mm single crystal InP wafer.

TABLE 1

| Process Parameter | Process A | Process B | Process C |
|---|---|---|---|
| Pressure (mTorr (Pa)) | 2 (0.667) | 2 (0.667) | 15 (2.00) |
| ICP Source Power (Watts) | 600 | 600 | 0 |
| Platen power (Watts) | 30 | 40 | 60 |
| $Cl_2$ flow (sccm) | 11 | 12 | 0 |
| $H_2$ flow (sccm) | 5 | 0 | 0 |
| $N_2$ flow (sccm) | 12 | 20 | 20 |
| $SiCl_4$ flow (sccm) | 0 | 0 | 40 |

An exemplary set of process parameters for the secondary plasma etch steps of the method of the first embodiment are shown in Table 2. The exemplary process was performed in the Omega™ etch apparatus at a temperature of 175° C. with source and bias RF power supplies operating at 13.56 MHz on a 75 mm single crystal InP wafer.

TABLE 2

| Process Parameter | Secondary Etch process |
|---|---|
| Pressure (mTorr (Pa)) | 5 (0.667) |
| ICP Source Power (Watts) | 500 |
| Platen power (Watts) | 30 |
| $O_2$ flow (sccm) | 50 |

Structures formed using the exemplary process parameters above had uniform and smooth base and sidewalls that were acceptable for use as waveguides.

The method of the first embodiment of the present invention can provide smooth and uniform features formed in an Indium-containing compound semiconductor in a flexible and simple process that does not require separate polishing or other mechanical processing steps.

The invention claimed is:

1. A method of plasma etching an indium-containing compound semiconductor substrate, the method comprising the steps of:
   providing a substrate on a substrate support within a chamber, wherein the substrate comprises an indium-containing compound semiconductor material;
   performing a primary plasma etching process by generating a plasma from a first etchant gas mixture within the chamber to plasma etch the indium-containing compound semiconductor material to form an etched substrate, wherein the first etchant gas mixture comprises a halogen-containing component and a nitrogen-containing component; and performing a secondary plasma etching process by generating a plasma from a second etchant gas or gas mixture comprising an oxygen-containing component, wherein an RF bias power is applied to the etched substrate during the secondary etching process and the RF bias power is between about 10 W and about 50 W.

2. The method according to claim 1, wherein the RF bias power applied to the substrate during the secondary etching process is between about 15 W and about 40 W.

3. The method according to claim 2, wherein the RF bias power applied to the substrate during the secondary etching process is between about 20 W and about 30 W.

4. The method according to claim 1, wherein the second etchant gas or gas mixture consists of the oxygen-containing component.

5. The method according to claim 1, wherein the oxygen-containing component comprises $O_2$, $H_2O$, $N_2O$ and/or $O_3$.

6. The method according to claim 5, wherein the oxygen-containing component is $O_2$.

7. The method according to claim 1, wherein the primary etching process is performed at a temperature of at least 150° C.

8. The method according to claim 7, wherein the primary etching process is performed at a temperature of between about 150° C. and about 250° C.

9. The method according to claim 8, wherein the primary etching process is performed at a temperature of about 175° C.

10. The method according to claim 1, wherein the halogen-containing component is a chlorine-containing component.

11. The method according to claim 10, wherein the chlorine-containing component is selected from the group consisting of $Cl_2$, $SiCl_4$ and $BCl_3$.

12. The method according to claim 11, wherein the chlorine-containing component is $Cl_2$.

13. The method according to claim 1, wherein the nitrogen-containing component is $N_2$.

14. The method according to claim 1, wherein the substrate comprises an inorganic dielectric mask formed on a surface which, during the etching process, is opposite a surface in contact with the substrate support.

15. The method according to claim 1, wherein the plasma generated in the primary and/or the secondary plasma etching process is an inductively coupled plasma.

* * * * *